United States Patent [19]
Hartauer

[11] Patent Number: 5,840,597
[45] Date of Patent: Nov. 24, 1998

[54] METHOD OF MAKING A SEMICONDUCTOR DEVICE FORCE AND/OR ACCELERATION SENSOR

[75] Inventor: Siegbert Hartauer, Landshut, Germany

[73] Assignee: Texas Instruments Incorporated, Dallas, Tex.

[21] Appl. No.: 789,515

[22] Filed: Jan. 27, 1997

Related U.S. Application Data

[60] Continuation of Ser. No. 448,717, May 24, 1995, abandoned, which is a division of Ser. No. 215,987, Mar. 22, 1994, abandoned.

[30] Foreign Application Priority Data

Mar. 22, 1993 [DE] Germany .......................... 43 09 206.3

[51] Int. Cl.⁶ .................................................. H01L 21/00
[52] U.S. Cl. .................................. 438/52; 438/50; 438/51
[58] Field of Search ............. 438/50–53; 148/DIG. 159; 216/2

[56] References Cited

U.S. PATENT DOCUMENTS

| | | |
|---|---|---|
| 4,204,185 | 5/1980 | Kurtz et al. . |
| 4,553,436 | 11/1985 | Hansson . |
| 4,668,865 | 5/1987 | Gimzewski et al. . |
| 4,706,374 | 11/1987 | Murakami . |
| 4,888,300 | 12/1989 | Burton . |
| 4,977,101 | 12/1990 | Yoder et al. ............................ 437/51 |
| 5,006,487 | 4/1991 | Stokes . |
| 5,121,180 | 6/1992 | Beringhause et al. ..................... 357/26 |
| 5,126,812 | 6/1992 | Greiff . |
| 5,129,983 | 7/1992 | Greiff . |
| 5,151,763 | 9/1992 | Marek . |
| 5,233,213 | 8/1993 | Marek . |
| 5,344,523 | 9/1994 | Fung . |
| 5,395,802 | 3/1995 | Kiyota et al. . |
| 5,427,975 | 6/1995 | Sparks et al. . |

FOREIGN PATENT DOCUMENTS 41 00 451 A1  7/1991  Germany ...................... G01P 15/125

OTHER PUBLICATIONS

Kurt E. Petersen, Silicon as a mechanical Material, Proceedings of the IEEE, vol. 70, No. 5, May 1982, pp. (except) 420, 439–442.

Primary Examiner—Olik Chaudhuri
Assistant Examiner—Kevin F. Turner
Attorney, Agent, or Firm—William B. Kempler; Richard L. Donaldson

[57] ABSTRACT

A semiconductor device with a force and/or acceleration sensor (12), which has a spring-mass system (14, 16) responsive to the respective quantity to be measured and whose mass (16) bears via at least one resilient support element (14) on a semiconductor substrate (20). The semiconductor substrate (20) and the spring-mass system (14, 16) are integral components of a monocrystalline semiconductor crystal (10) with a IC-compatible structure. The three-dimensional structural form of the spring-mass system (12) is produced by anisotropic semiconductor etching, defined P/N junctions of the semiconductor layer arrangement functioning as etch stop means in order to more particularly create a gap (22) permitting respective movement of the mass (16) between the mass (16) and the semiconductor substrate (20).

8 Claims, 5 Drawing Sheets

METHOD OF MAKING A SEMICONDUCTOR DEVICE FORCE AND/OR ACCELERATION SENSOR

This application is a Continuation of application Ser. No. 08/488,717, filed May 24, 1995; which is a divisional application of parent application Ser. No. 08/215,987 filed on Mar. 22, 1994, both now abandoned.

BACKGROUND OF THE INVENTION

The invention relates to a semiconductor device with a force and/or acceleration sensor, which has a spring-mass system responsive to the respective quantity to be measured, whose mass bears via at least one resilient support element on a semiconductor substrate, and with which at least one transducer is associated, which supplies a corresponding measuring data signal. The invention furthermore relates to a method for the manufacture of such a semiconductor device.

In the case of such devices the spring-mass system is provided on a semiconductor substrate for obtaining a maximum degree of integration. Owing to the defined freely oscillating mass the sensor reacts more particularly to a respective acceleration so that using such a device it is possible to measure both a force and also an acceleration. In this respect inter alia the piezoresistive effect is utilized in order to obtain a measuring data signal which is representative for the quantity which is to be measured.

For the manufacture of known piezoresistive sensors the entire thickness of the semiconductor wafer is frequently included in the structure of the spring-mass system ("bulk micromachining"). In this respect however the intended reduction in the size of the chip area is distinctly limited owing to features of the electrochemical anisotropic silicon etch process. Moreover top and bottom plates are necessary in order to be certain that the sensors will function. In the case of the production of such a three-chip design it is furthermore a problem to join the different wafers together. the case of one known single chip design there is a provision for transfer structures comprising the spring-mass system and furthermore the transducer on the surface of one semiconductor wafer, into which the processing logic system may also be integrated ("surface micromachining"). In this respect the measuring and transfer structures are produced by the application of polysilicon layers, which generally have such an inherent stress for this reason the transfer function is affected in an undesired manner. In fact the different production parameters have a pronounced effect on the reproducibility and sensitivity of the sensors.

SUMMARY OF THE INVENTION

In contradistinction to this one object of the invention is to provide such an improved semiconductor device of the type initially mentioned and method of producing the same that while ensuring an optimum reproducibility of the transfer function of the spring-mass system and a high sensitivity there is the highest possible degree of integration.

This object is to be achieved in accordance with the invention since in the semiconductor device the mass, the support element and the semiconductor substrate integrally consist of monocrystalline semiconductor material and between the mass and a section of the semiconductor substrate opposite thereto a gap is provided which permits a respective movement of the mass.

Owing to this design there is a single chip element with the simultaneous integration of a monocrystalline transfer structure. Such a semiconductor device is not only extremely cheap to produce but furthermore owing to transfer structures consisting of monocrystalline semiconductor material the piezoresistive effect utilized for the force-stress transfer or transduction, is able to be extremely exactly reproduced while at the same time there is always a high sensitivity. Despite the high degree of integration an effect on the transfer function by inherent stresses of the different layers of the layer structure produced is practically out of the question.

Although the said advantages occur more particularly in the case of use of the piezoresistive effect for measurement of force and/or acceleration, it is possible for the measurement to be on the basis of a capacitive effect, for which purpose the capacitance present between the freely oscillating mass and the semiconductor substrate separated from the same by the air gap may be taken advantage of. A further point to be considered is that of possibly using both effects jointly. Finally the resulting capacity may be employed for a self-test.

The air gap between the mass and the semiconductor substrate renders possible not only a respective movement of the mass under the action of a force or, respectively, an acceleration, by having suitable dimensions, that is to say in the case of a sufficiently small depth, it may also serve to provide a damping action and protection against overloading.

If for the measurement of force and/or acceleration the piezoresistive effect is to be profited from, it is then convenient for the transducer to comprise at least one monocrystalline piezoresistor incorporated in the support element, which may be more particularly constituted by a zone doped with impurity atoms, in the support element consisting of monocrystalline semiconductor material. These piezoresistors are preferably provided at the flexure-responsive parts of the support elements, each respective support element more particularly being able to have a plurality of such piezoresistors.

A preferred form of the semiconductor device in accordance with the invention is characterized in that on the semiconductor substrate two mutually contiguous epitaxial layers of different conductivity are arranged and the mass is at least substantially formed in the first, inner epitaxial layer and the support element is formed in the second, outer epitaxial layer, the mass being at least substantially preferably constituted by a zone, which is incorporated in the inner epitaxial layer, is etched so as to be free therein and doped to be conductive, same belonging to the same type of conductivity as the semiconductor substrate and the outer epitaxial layer, which type is opposite to the conductivity of the inner epitaxial layer.

More particularly with such a design of the semiconductor device it readily becomes possible to have the semiconductor substrate and the spring-mass system as an integral components of a semiconductor crystal with an IC-compatible structure, it being possible for example for this semiconductor crystal to have a bipolar and/or CMOS structure.

As a semiconductor material it is more particularly possible to utilize silicon.

In the case of one particular modification of the semiconductor device in accordance with the invention there is an N-semiconductor substrate, on which first a P-epitaxial layer and then an N-epitaxial layer is applied, the mass being defined by an etchingly exposed, $N^+$-doped zone in the P-epitaxial layer.

The method for the production of the semiconductor device is characterized in that on one side of a conductive semiconductor substrate at least one zone doped to be conductive is incorporated, whose conductivity is opposite to that of the semiconductor substrate, that following this a first conductively predoped epitaxial layer of the same type of conductivity as the conductively doped zone is applied, that in the first epitaxial layer at least one zone, which is doped to be conductive, of the same type of conductivity as the semiconductor substrate is incorporated in order to constitute, at least substantially, the mass of a spring-mass system of the force and/or acceleration sensor in the bidimensional structure produced, that following this on the first epitaxial layer a second conductively predoped epitaxial layer of the same type of conductivity as the semiconductor substrate is applied, that on the second epitaxial layer the mass of the spring-mass system and at least one support element constituting the spring thereof are so masked that following this by electrochemical anisotropic semiconductor etching the three-dimensional structure of the spring-mass system and also etch openings are produced in the mass, both the mass and also the support element being underetched.

As a semiconductor material silicon is again preferably employed, in which case the three-dimensional structure of the spring-mass system is produced by electrochemical anisotropic silicon etching.

Further advantageous forms of the semiconductor device in accordance with the invention and of the method of production in accordance with the invention are recited in the dependent claims.

BRIEF DESCRIPTION OF THE DRAWINGS

The invention will now be described in following in the form of an account of one working embodiment with reference to the drawings.

DETAILED DESCRIPTION

Figure 1:
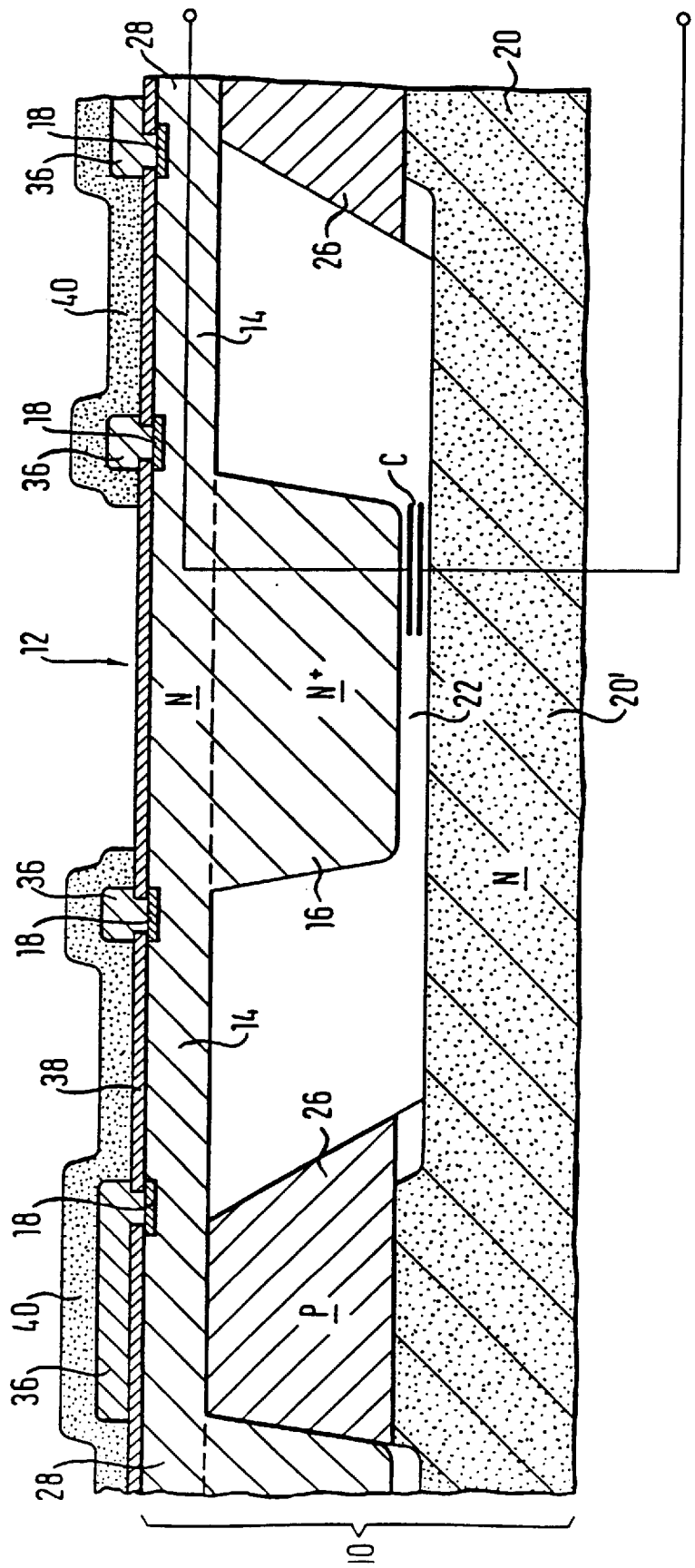
FIG. 1 is partly sectioned representation of a semiconductor device having an integrated force and/or acceleration sensor.

FIG. 1 shows, in a partly sectioned view, a semiconductor device constituted by a monocrystalline silicon semiconductor crystal 10, and which comprises an integrated force and/or acceleration sensor 12.

The force and/or acceleration sensor 12 comprises a spring-mass system 14 and 16 responsive to the respective quantity to be measured and with which a plurality of transducers are associated which are constituted by a respective piezoresistor 18 in order to produce respective measuring data signals.

The mass 16 of the spring-mass system 14 and 16 is borne on an N-semiconductor 20, which consists of monocrystalline silicon, by means of four support elements (14 (see furthermore FIG. 5) constituting the spring part thereof. In this respect between the mass 16 and a lower section 20' opposite thereto, of the N-semiconductor substrate 20 there is an air gap 22 permitting a respective movement of the mass 16. The capacitance C occurring at this gap 22 between the mass 16 and the section 20' of the N-semiconductor substrate 20 may also be utilized as a transducer and/or be employed for a self-test or the like.

In the illustrated working embodiment of the invention on each side of the mass 16 two respective beam-like support elements 14 are provided, in which on the top side respectively two piezoresistors 18 are incorporated in the manner to be described below. These piezoresistors 18 are arranged at the flexure-sensitive points of the support element 14 in parts adjacent to the mass 16 and the outer support positions. In this respect the four beam-like support elements 14 are in a common plane, from which the mass 16 projects downwards towards the N-semiconductor substrate 20.

The mass 16 which is connected the support elements 14 and in other respects is exposed by etching, is generally square in form (see also FIG. 5) as seen in a cross section parallel to the support plane.

The electrically contacted piezoresistors 18 are connected with metallic conductors 36, which are applied to a silicon oxide layer 38 (to be described in detail further below) with which the support elements 14 and the layer of the semiconductor crystal 10 containing them are coated. Externally the semiconductor device is coated with a passivating layer 40 apart from the mass 16 and the connection surfaces.

The semiconductor crystal 10 consisting of monocrystalline silicon comprises, in addition to the N-semiconductor substrate 20, a first, inner P-epitaxial layer 26 and furthermore a second outer N-epitaxial layer 28, which is applied directly to it. In this respect the mass 16 is at least substantially constituted or, respectively, etched free in the inner P-epitaxial layer, whereas the support elements 14 are also formed by etching in the outer N-epitaxial layer 28.

In this respect the mass is at least substantially defined by an $N^+$-doped zone, which is incorporated in the inner P-epitaxial layer 26, and which zone has been exposed by etching in the manner still to be described in following. Lastly the P-epitaxial layer 26 also functions as a base (see in FIG. 1 the parts of this layer 26 depicted to the left and to the right, by which the spring-mass system 14 and 16 is supported on the N-semiconductor substrate 20.

Figure 7:
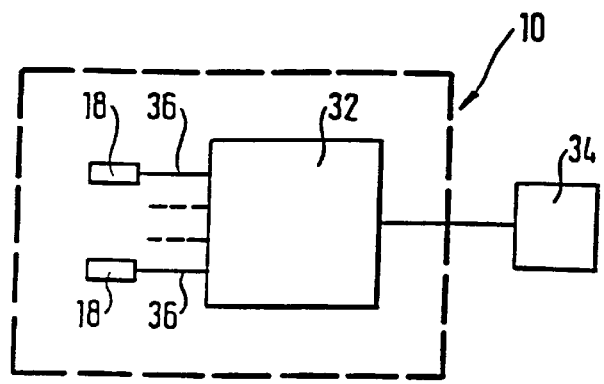
FIG. 7 is a circuit diagram to show the principle of the integrated circuit produced with the integrated force and/or acceleration sensor and integrated processing logic.

The N-semiconductor substrate 20 and the spring-mass system 14 and 16 produced by the two epitaxial layers 26 and 28 accordingly constitute integral components of the semiconductor crystal 10 consisting of monocrystalline silicon and which is furthermore structured so as to be IC-compatible so that for instance it is also possible for electronic processing circuitry 32 (see also FIG. 7) or the like to be integrated in this semiconductor crystal 10. For this purpose it is possible for the semiconductor crystal be more especially have a bipolar and/or CMOS structure. The piezoresistors 18, which may for instance be connected together in a bridge circuit, are then to be connected via the metallic conductors 36 with the integrated processing electronic circuitry 32 as shown in FIG. 7 purely diagrammatically. The electronic processing circuitry 32 may include an associated indicating means 34.

Figure 2:
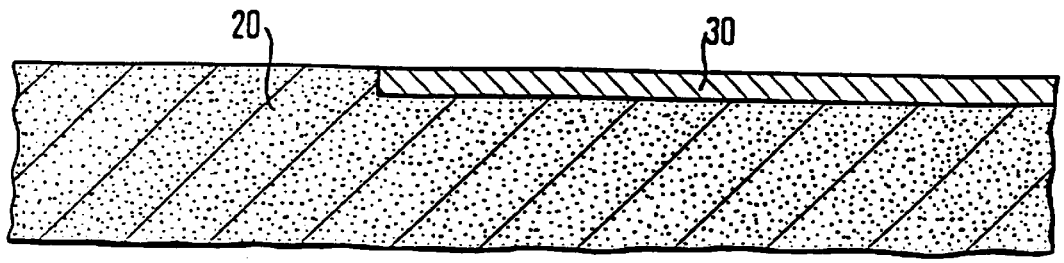
FIGS. 2 to 4 show individual method steps for the stratified build-up of the semiconductor device, with which first a bidimensional structure of the spring-mass system is produced.
Figure 3:
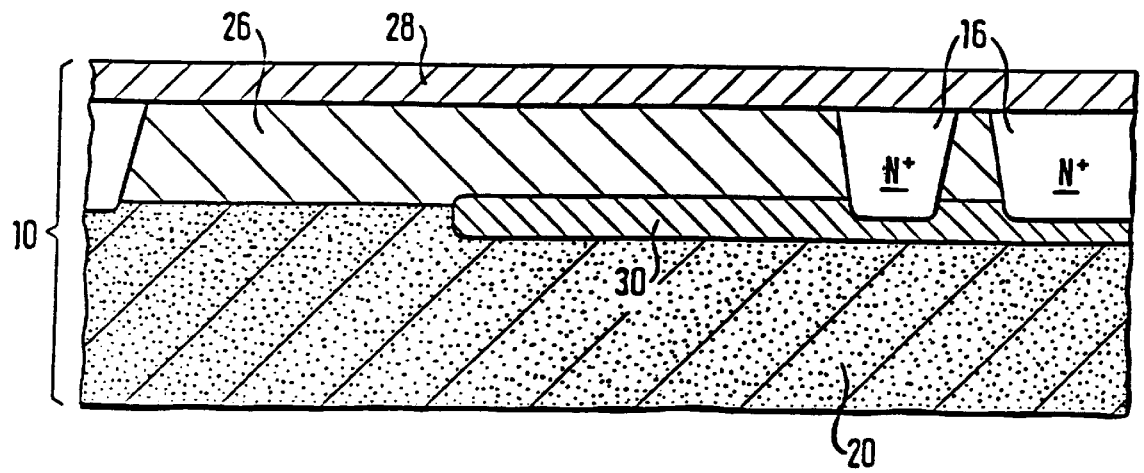
Figure 4:
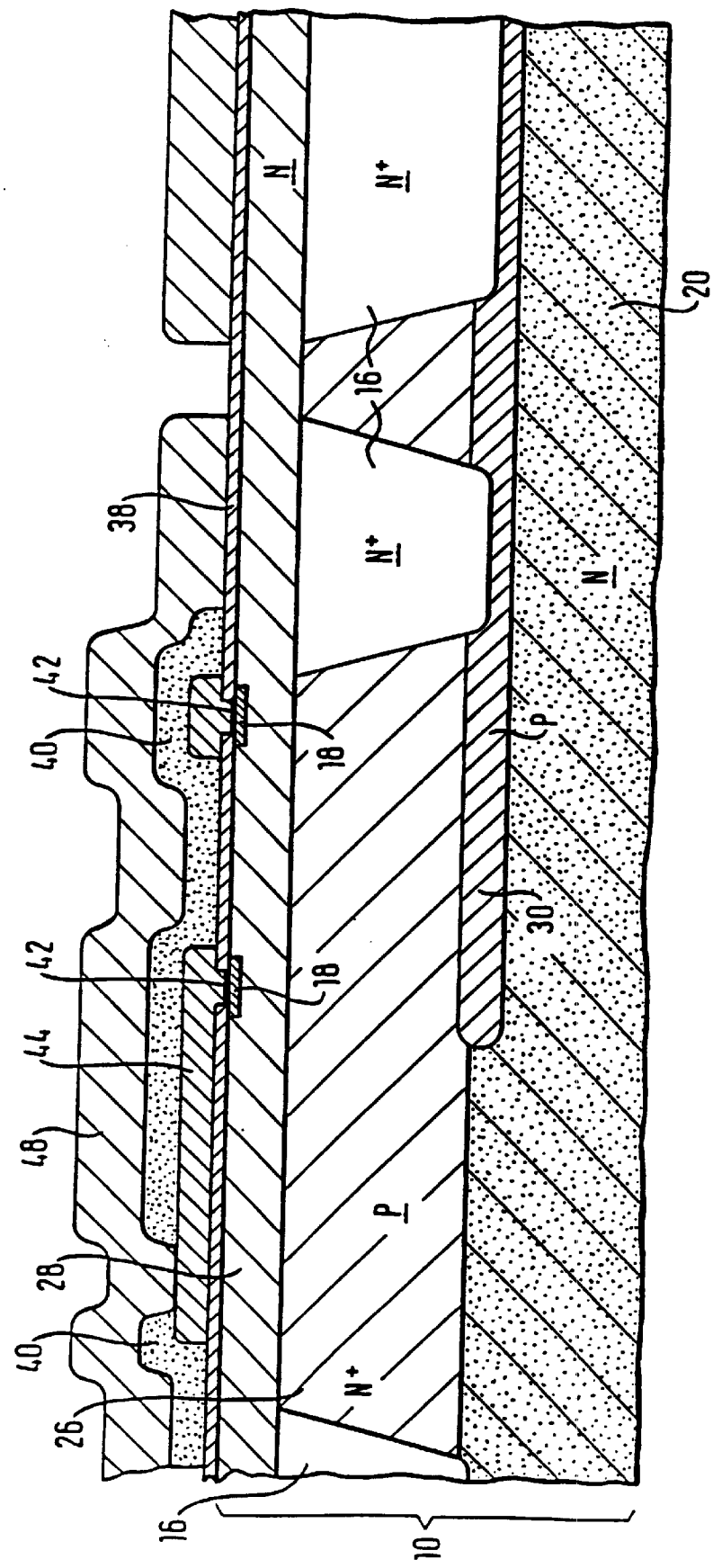

FIGS. 2 through 4 show the individual method steps in the manufacture of the semiconductor device, with which firstly a bidimensional structure of the spring-mass system 14 and 16 and furthermore an IC-compatible structured form of the monocrystalline silicon semiconductor crystal 10 is produced.

In accordance with FIG. 2 firstly on one side of the N-semiconductor substrate 20 at least one P-doped zone 30 is incorporated, which is so dimensioned that it at least includes the area part determined by the mass 16 and the support element 14 (see also FIG. 1) in order to be employed in the manner to be described in following as an underetching adjuvant. In the illustrated working embodiment of the invention the process with a [100] silicon substrate polished on one side whose resistance value is in a range of 1 to 10 ohms. An oxide layer is then applied to this semiconductor substrate 20, in which oxide layer by masking and etching steps a window is opened for the P-doped zone 30. After the etching operation the surface is cleaned. Then the P-doped zone 30 is produced by diffusion with a thickness of approximately 6 μm and a resistance value of for example 110 ohm/squ. Doping may be by ion implantation instead of by diffusion. Once the zone 30 has been produced, the entire oxide layer is removed again.

Then in accordance with FIG. 3 the first inner P-epitaxial layer 26 is applied, which for instance has a resistance value of approximately 2 kohm/squ and a thickness of approximately 20 μm. After this, preferably by thermal oxidation (1100° C./8500 A) an oxide layer is again applied, in which by masking and etching steps a window is opened for an N+-doped zone defining the mass 16. After the etching operation cleaning is repeated, this being followed by diffusion with a thickness in a range of approximately 20 μm to 22 μm in the inner P-epitaxial layer 26, after which the oxide layer is again completely removed. The next step is the application of the outer N-epitaxial layer 28 on the inner P-epitaxial layer 26 so that the semiconductor crystal 10, which is structured to be IC-compatible and consists of monocrystalline silicon, is obtained. Although the N+-doped zone is preferably produced by diffusion, there is in this case as well the basic possibility of doping by ion implantation.

As shown in FIG. 4 the oxide layer 38 is then applied to the outer N-epitaxial layer 28. In this oxide layer 38 masking and etch steps are used to produce windows for P-doped zone in order to produce the piezoresistors 18. These piezoresistors 18 produced by P-zones in the outer N-epitaxial layer 28 have for instance a resistance value of 300 ohm/squ. After cleaning the previously produced implant is burnt out. Then masking and steps are employed to provide windows for contacts are opened in the oxide layer 38, following which there is again a thorough cleaning operation. The surface is then plated with platinum and sintering is performed. Then the platinum is etched in order to produce platinum contacts 42 on the piezoresistors 18.

Then a metallic layer 44, for instance of TiW or Al, is applied, something which for example may be performed by electrolysis (TiW, 2kA: Al, 6kA). By masking and etching steps the desired conducting paths or, respectively, metallic conductors 36 (see FIG. 1) are formed, the piezoresistors 18 associated with different support elements 14 being for example connected with one another as a bridge or the like.

After this chemical vapor deposition is used to apply the oxide passivation layer with planarization. In this passivating layer 40, using masking and etching steps, windows are produced over the mass 16 and the connection surfaces. After dry etching there is again a thorough cleaning operation.

The steps of the method so far will have now set the bidimensional structure of the spring-mass system 14 and 16 and the electrical contacting of the piezoresistors 18, in which respect at the same time an IC-compatible structure of the semiconductor crystal 10 is obtained, which for instance can have a bipolar and/or CMOS structure. In the monocrystalline silicon semiconductor crystal 10 it is accordingly readily possible for the electronic processing system 32 to be integrated (see FIG. 7). The respective transistor structures may more especially be incorporated after the application of the outer N-epitaxial layer 28 and prior to the application of the oxide layer 38.

For the manufacture of the three-dimensional structure of the spring-mass system 14 and 16 vapor deposition (CVD method) is again employed to provide a silicon nitride layer 48, which in the following silicon etching functions as a protective layer.

Figure 5:
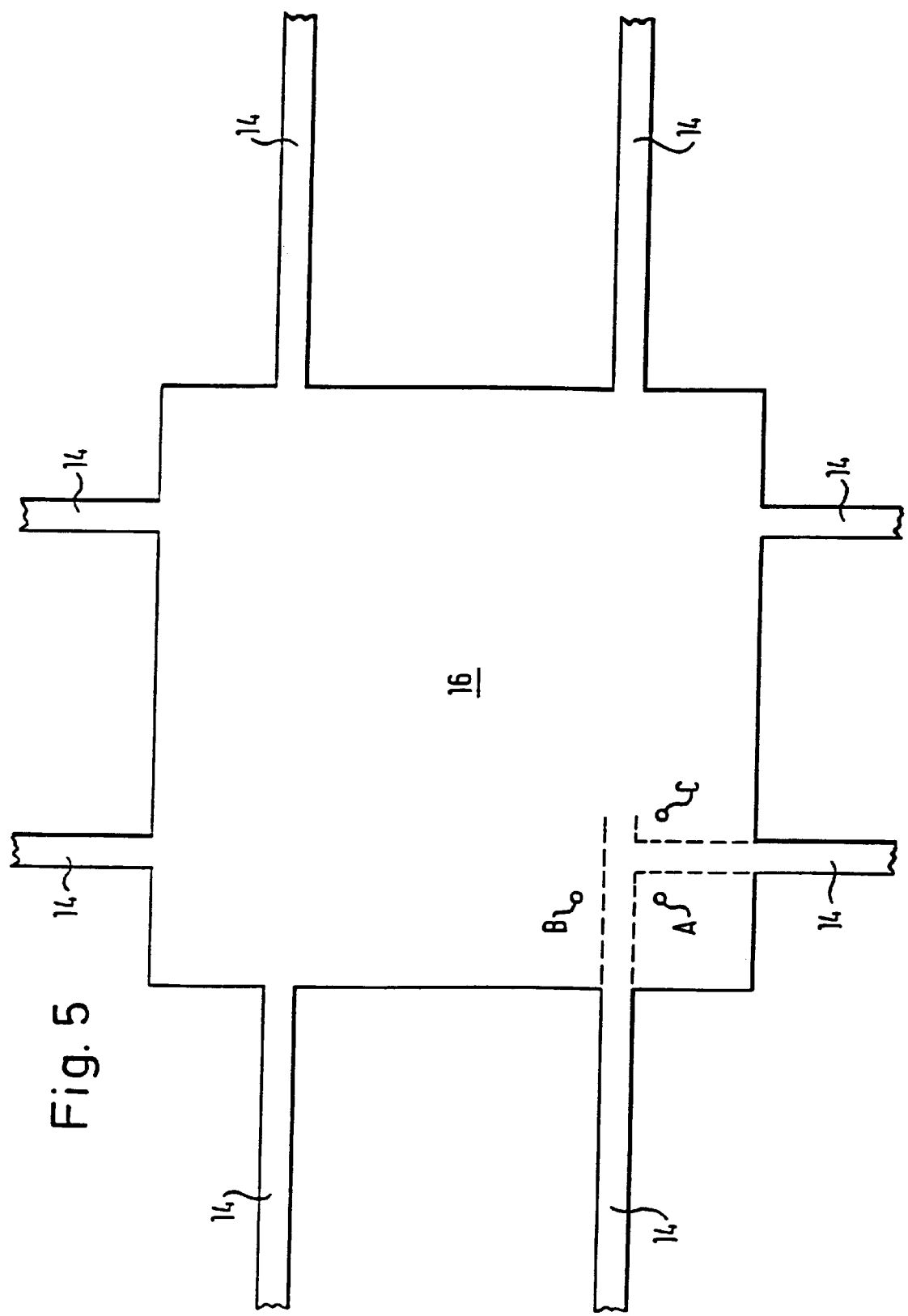
FIG. 5 diagrammatically shows the masking of the mass and of the support elements of the spring-mass system.

By masking and etching steps, in the case of which dry etching of the silicon nitride is implemented, the support elements 14 and furthermore the mass 16 of the spring-mass system 14 and 16 are masked in the manner indicated purely diagrammatically in figure 5, after which the essentially square mass 16 is to be supported on each side via respectively two beam-like support elements 14 on the semiconductor substrate 20 (FIG. 1). For the masking of the mass 16 and of the support elements 14 it is necessary for etching openings A, B and C to be provided in the mass. These etching openings A, B than C are so arranged that the positions, at which the etching fronts meet at an angle of less than 180°, are kept free. In FIG. 5 etching openings are only depicted in one corner. In fact however such openings are provided in all four corner parts.

Figure 6:
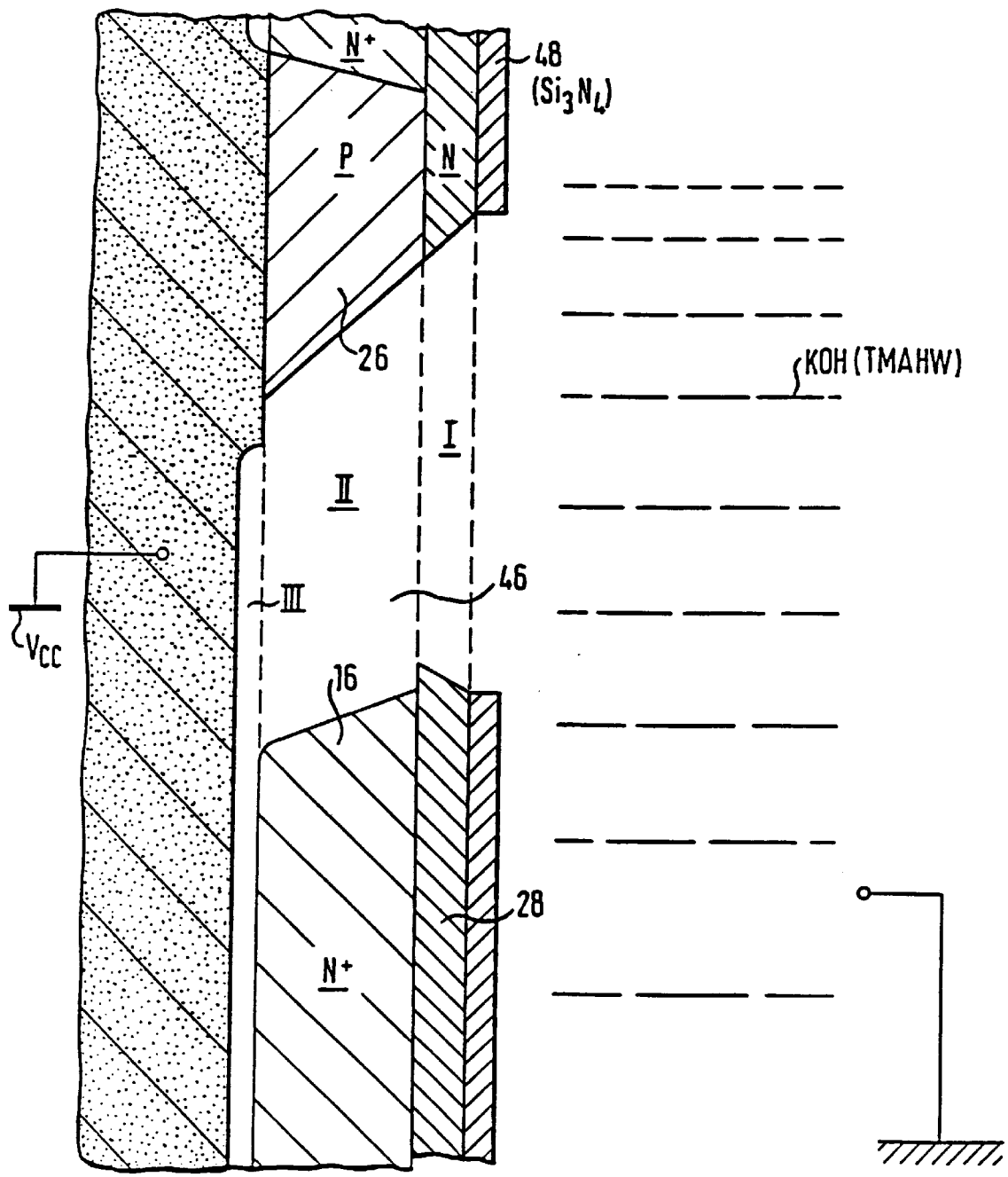
FIG. 6 shows individual method steps for the production of the three-dimensional structure of the spring-mass system.

In FIG. 6 the individual method steps for the production of the three-dimensional structure of the spring-mass system 14 and 16 are to be seen.

This three-dimensional structure is produced in accordance with the invention by electrochemical anisotropic silicon etching, in the case of which more especially the P/N junctions, previously defined in the desired manner, are employed as an etching stop means, and in this respect both the support elements 14 and the mass 16 as well are underetched.

The silicon nitride mask functions to mask not only the beam-like support elements 14 but further the part of the mask 16, which is furthermore defined by the N+-doped zone provided in the inner P-epitaxial layer 26. The dimensions of the beam-like support elements 14 and of the mass 16 of the spring-mass system 14 and 16 may be varied in the desired manner, both the damping characteristics and furthermore the sensitivity being predetermined substantially as desired.

For the anisotropic silicon etching described in connection with FIG. 6 it is possible to use caustic potash KOH, TMAHW or like etchant or an electrolyte.

With the step I shown in FIG. 6 firstly the outer N-epitaxial layer 28 is etched through as far as the inner P-epitaxial layer 26 after previously having made certain that all structures have the same potential $V_{CC}$ in relation to the etching solution.

After this measures are take to see that all N- and N+-structures have possess a sufficient anodic potential. Then in the step II the P-parts are etched fully in the [100] direction.

The next operation is to again ensure that all N- and N+-structures are at a sufficient anodic potential, following which in the step II both the mass and also the beams 14 are underetched without this involving an attack on the N- and N+-parts. The end of the course of the process is to be clearly recognized by a drop in the system current and the development of bubbles of $H_2$.

It will be seen from this that more particularly the P-doped zone 30 (see FIGS. 2 through 4) functions an adjuvant for the underetch since it forms P/N junctions on the one hand with the N-semiconductor substrate 20 and on the other hand with the mass 16 defined by the N$^+$-doped zone, which junctions serve as an etch stopping means during anisotropic silicon etching. This P-doped zone 30 is completely removed during the course of the anisotropic silicon etching process. The mass 16, which is underetched on the removal of this zone 30, is also etched free at the sides during the step II, the upper edge, which may be seen in FIG. 6, of the part 46, which is exposed by etching, being set by the anisotropy of the etching operation.

Then after this the silicon nitride layer 48 is completely removed, for example by plasma etching (A24D).

In principle it is possible to provide a plurality of spring-mass systems 14 and 16 on each respective silicon wafer. These spring-mass systems may be kept on a common silicon wafer or they can be separated, something which may be performed by, for instance, water jet cutting, by scoring and breaking or by laser cutting.

The invention consequently provides a semiconductor device, in the case of which the semiconductor substrate and the spring-mass system are integral parts of a semiconductor crystal with an IC-compatible structure, and which for instance may have a bipolar or CMOS structure. The semiconductor device in accordance with the invention has a chip area which is substantially smaller than that of known designs. The monocrystalline support beams possess greater and more exactly reproducible piezoresistive constants. Owing to the structure provided by the invention there is no possibility of the transfer function being affected by the inherent stress of certain layers. The dimensions of the structure, which more particularly determines the spring-mass system may be better adapted to respective requirements. Moreover it is possible to obtain an integral lateral capacitance, which, at a minimum stray currents, may for example be utilized for a selftest.

I claim:

1. A method of making a semiconductor device for sensing force and/or acceleration, comprising the steps of:

providing a substrate of semiconductor material of a first conductivity type;

depositing a first epitaxial layer of a second conductivity type on the semiconductor substrate of the first conductivity type;

forming an area of said first conductivity type in a portion of said first epitaxial layer to define a mass;

depositing a second epitaxial layer of said first conductivity type on said first epitaxial layer, said second epitaxial layer being integrally connected to said mass;

etching a portion of said first epitaxial layer surrounding said mass to form a gap between said mass and said substrate and to form a space on sides of said mass, whereby said mass is coupled to a remaining portion of said first epitaxial layer by an integrally formed support element;

forming a transducer on the second epitaxial layer, in a region of the resilient support element, responsive to flexure of the resilient support element induced by movement of the mass relative to the semiconductor substrate to provide an output data signal; and wherein the mass, the first and second epitaxial layers, and the semiconductor substrate are formed as an integral body of monocrystalline semiconductor material.

2. The method of claim 1 wherein the semiconductor material is silicon.

3. The method of claim 1 wherein the transducer is a monocrystalline piezoresistor disposed in the region of the resilient support element.

4. The method of claim 1 wherein the mass, the gap, and opposing semiconductor substrate are formed to define a capacitance dependent upon the distance between the mass and the opposing surface of the semiconductor substrate.

5. The method of claim 1 wherein the first conductivity type imparted to the mass is of increased concentration in relation to the concentration of the first conductivity type imparted to the second epitaxial layer and the semiconductor substrate.

6. The method of claim 1 wherein the mass is symmetrically formed including two sets of sides, and the resilient support element has at least one support arm integral extending from each side of the mass, the support arms being coplanar.

7. The method of claim 6 wherein the resilient support element includes respective pairs of support arms integral with each of the sides of the mass and distributed about the periphery of the mass.

8. The method of claim 6 wherein the mass has a substantially square horizontal cross-sectional shape.

* * * * *